United States Patent
Li (10) Patent No.: US 10,505,130 B2
(45) Date of Patent: Dec. 10, 2019

(54) FLEXIBLE DISPLAY PANEL, METHOD FOR FABRICATING FLEXIBLE DISPLAY PANEL AND FLEXIBLE DISPLAY DEVICE

(71) Applicant: BOE TECHNOLOGY GROUP CO., LTD., Beijing (CN)

(72) Inventor: Yunfei Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/737,216

(22) PCT Filed: Jun. 28, 2017

(86) PCT No.: PCT/CN2017/090531
§ 371 (c)(1),
(2) Date: Dec. 15, 2017

(87) PCT Pub. No.: WO2018/054118
PCT Pub. Date: Mar. 29, 2018

(65) Prior Publication Data
US 2018/0375040 A1 Dec. 27, 2018

(30) Foreign Application Priority Data
Sep. 26, 2016 (CN) .......................... 2016 1 0847294

(51) Int. Cl.
*H01L 51/00* (2006.01)
*H01L 27/32* (2006.01)
*G09F 9/30* (2006.01)

(52) U.S. Cl.
CPC .......... *H01L 51/0097* (2013.01); *G09F 9/301* (2013.01); *G06F 2203/04102* (2013.01);
(Continued)

(58) Field of Classification Search
CPC ......... H01L 2251/5338; H01L 51/0097; H01L 2227/323; H01L 25/0753; H01L 27/323;
(Continued)

(56) References Cited

U.S. PATENT DOCUMENTS

2007/0062639 A1* 3/2007 Chang ................. B32B 37/1292
156/291
2013/0169515 A1 7/2013 Prushinskiy et al.
(Continued)

FOREIGN PATENT DOCUMENTS

CN 102902109 A 1/2013
CN 103985321 A 8/2014
(Continued)

OTHER PUBLICATIONS

Office Action received for Chinese Patent Application No. 201610847294.0, dated Sep. 4, 2017, 13 pages (7 pages of English Translation and 6 pages of Office Action).
(Continued)

*Primary Examiner* — Hong Zhou
(74) *Attorney, Agent, or Firm* — Womble Bond Dickinson (US) LLP (57) ABSTRACT

A flexible display panel, a method for fabricating the same and a flexible display device are disclosed. The flexible display panel comprises at least two functional layers which are stacked one another and an adhesive layer which is arranged between the functional layers. The flexible display panel has a bending axis parallel with a surface of the flexible display panel. The adhesive layer comprises a first adhesive part at a side of the bending axis and a second adhesive part at the other side. The first and second adhesive parts have a cross-sectional shape in a plane perpendicular with the bending axis, and the cross-sectional shape is oriented with respect to a vertical cross section of the
(Continued)

flexible display panel running through the bending axis to reduce the bending stress in the flexible display panel during bending in the bending axis.

16 Claims, 6 Drawing Sheets (52) U.S. Cl.
CPC .. *G06F 2203/04103* (2013.01); *H01L 27/323* (2013.01); *H01L 2251/5338* (2013.01)

(58) Field of Classification Search
CPC ......... G06F 3/0412; G06F 2203/04102; G06F 2203/04103
See application file for complete search history.

(56) References Cited

U.S. PATENT DOCUMENTS

| | | | |
|---|---|---|---|
| 2015/0102296 A1 | 4/2015 | Kim et al. | |
| 2016/0155967 A1* | 6/2016 | Lee | H01L 51/5281 257/88 |
| 2016/0231837 A1* | 8/2016 | Baek | G06F 3/044 |
| 2016/0320803 A1* | 11/2016 | Oh | G06F 1/1652 |
| 2016/0320885 A1* | 11/2016 | Kim | G06F 3/0412 |
| 2017/0133407 A1 | 5/2017 | Sun et al. | |
| 2017/0262022 A1* | 9/2017 | Choi | G02B 5/3025 |

FOREIGN PATENT DOCUMENTS

| | | |
|---|---|---|
| CN | 104716148 A | 6/2015 |
| CN | 106228910 A | 12/2016 |
| JP | 2009-110780 A | 5/2009 |

OTHER PUBLICATIONS

Office Action received for Chinese Patent Application No. 201610847294.0, dated Nov. 23, 2017, 8 pages (5 pages of English Translation and 3 pages of Office Action).
International Search Report received for PCT Patent Application No. PCT/CN2017/090531, dated Aug. 30, 2017, 6 pages (2 pages of English Translation and 4 pages of Original Document).
"Third office action," CN Application No. 201610847294.0 (dated May 10, 2018).

* cited by examiner

FLEXIBLE DISPLAY PANEL, METHOD FOR FABRICATING FLEXIBLE DISPLAY PANEL AND FLEXIBLE DISPLAY DEVICE

RELATED APPLICATIONS

The present application is the U.S. national phase entry of PCT/CN2017/090531, with an international filing date of Jun. 28, 2017, which claims the benefit of Chinese Patent Application No. 201610847294.0, filed on Sep. 26, 2016, the entire disclosures of which are incorporated herein by reference.

TECHNICAL FIELD

The present disclosure relates to the field of display technology, and particularly to a flexible display panel, a method for fabricating the same, and a flexible display device.

BACKGROUND

With the continuous development of display technology, a flexible display device has been developed to meet the requirement for a bendable display device. As compared with a conventional rigid display device, the flexible display device has advantages of light and thin, bendable property, and excellent mechanical property.

However, peeling may occur in stacked layers in the flexible display device during bending, which damages the display device.

SUMMARY

Embodiments of the present disclosure provide a flexible display panel, a flexible display device, and a method for fabricating a flexible display panel.

It is an objective of the present disclosure to provide a flexible display panel.

A first aspect of the present disclosure provides a flexible display panel. The flexible display panel comprises: at least two functional layers which are stacked one another and an adhesive layer which is arranged between the at least two functional layers, wherein the flexible display panel has a bending axis parallel with a surface of the flexible display panel, wherein the adhesive layer comprises a first adhesive part at a side of the bending axis and a second adhesive part at the other side of the bending axis, wherein the first adhesive part and the second adhesive part have a cross-sectional shape in a plane perpendicular with the bending axis, and the cross-sectional shape is oriented with respect to a vertical cross section of the flexible display panel which runs through the bending axis, so as to reduce the bending stress in the flexible display panel during bending in the bending axis.

In an embodiment, the first adhesive part comprises a plurality of adhesive members which are spaced apart, the second adhesive part comprises a plurality of adhesive members which are spaced apart, and the adhesive members of the first adhesive part and the adhesive members of the second adhesive part have extending directions which are parallel with each other.

In an embodiment, the extending directions of the adhesive members are parallel with an extending direction of the bending axis.

In an embodiment, each adhesive member in the first adhesive part and the second adhesive part has a bottom part and a top part, and the bottom part is closer to the vertical cross section of the flexible display panel than the top part, so as to be suitable for a downward bending direction.

In an embodiment, each adhesive member in the first adhesive part and the second adhesive part has a top part and a bottom part, and the top part is closer to the vertical cross section of the flexible display panel than the bottom part, so as to be suitable for an upward bending direction.

In an embodiment, each adhesive member in the first adhesive part and the second adhesive part has a top part and a bottom part, and a distance from the top part to the vertical cross section of the flexible display panel equals to a distance from the bottom part to the vertical cross section of the flexible display panel, so as to be suitable for upward or downward bending direction.

In an embodiment, the at least two functional layers comprise a display layer and a touch layer which is arranged on the display layer.

In an embodiment, a projection of the adhesive layer on the display layer does not overlap with a pixel region of the display layer.

In an embodiment, the at least two functional layers further comprise:

an upper protection layer which is arranged on the touch layer; and a lower protection layer which is arranged below the display layer, wherein the adhesive layer comprises:

a first adhesive layer which is arranged between the display layer and the touch layer;

a second adhesive layer which is arranged between the display layer and the lower protection layer; and a third adhesive layer which is arranged between the touch layer and the upper protection layer.

In an embodiment, the lower protection layer comprises a lower protection film;

the display layer comprises: a flexible substrate which is arranged on the lower protection film, a substrate which is arranged on the flexible substrate, a light emitting layer which is arranged on the substrate, and an encapsulating layer which is arranged on the light emitting layer;

the touch layer comprises: a touch screen panel sensor which is arranged on the encapsulating layer, and a polarizing filter which is arranged on the touch screen panel sensor;

the upper protection layer comprises an upper protection film.

In an embodiment, the first adhesive layer, the second adhesive layer and the third adhesive layer have extending directions which are parallel with each other.

It is another objective of the present disclosure to provide a method for fabricating a flexible display panel.

A second aspect of the present disclosure provides a method for fabricating a flexible display panel. The method for fabricating a flexible display panel comprises:

forming at least two functional layers;

forming an adhesive layer;

bonding the at least two functional layers by means of the adhesive layer, wherein forming the adhesive layer comprises forming the adhesive layer which comprises a first adhesive part at a side of a bending axis which is parallel with a surface of the flexible display panel and a second adhesive part at the other side of the bending axis, wherein the first adhesive part and the second adhesive part have a cross-sectional shape in a plane perpendicular with the bending axis, and the cross-sectional shape is oriented with respect to a vertical cross section of the flexible display panel which runs through the bending axis, so as to reduce the bending stress in the flexible display panel during bending in the bending axis.

In an embodiment, the extending directions of the adhesive members are parallel with an extending direction of the bending axis.

In an embodiment, forming the adhesive layer comprises forming the adhesive layer by at least one of imprinting and printing.

It is yet another objective of the present disclosure to provide a flexible display device.

A third aspect of the present disclosure provides a flexible display device. The flexible display device comprises the flexible display panel as described above.

BRIEF DESCRIPTION OF THE DRAWINGS

To make the objects, the technical solutions and the advantages of embodiments of the present disclosure more apparent, the technical solutions of the embodiments of the present disclosure will be described in detail hereinafter in conjunction with the drawings of the embodiments of the present disclosure.

DETAILED DESCRIPTION OF EMBODIMENTS

To make the objects, the technical solutions and the advantages of embodiments of the present disclosure more apparent, the technical solutions of the embodiments of the present disclosure will be described in detail hereinafter in conjunction with the drawings of the embodiments of the present disclosure. Apparently, the embodiments described hereinafter are only some embodiments of the present disclosure, but not all embodiments. Based the embodiments described hereinafter, other embodiments obtained by those skilled in the art should fall within the scope of the present disclosure.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

For the purpose of describing a surface, the terms "over", "below", "left", "right", "perpendicular", "horizontal", "top", "bottom", and there derivatives shall be read in the context. The terms "overlying", "on the top of", "located on" or "located on the top of" mean that a first element such as a first structure is present on a second element such as a second structure, and an intermediate element such as an interfacial structure may be present between the first element and the second element. The term "contact" means that a first element such as a first structure is connected with a second element such as a second structure, while another element may be present or absent at the interface therebetween.

An embodiment of the present disclosure provides a flexible display panel. The flexible display panel comprises at least two functional layers which are stacked one another and an adhesive layer which is arranged between the functional layers. The flexible display panel has a bending axis parallel with a surface of the flexible display panel. The adhesive layer comprises a first adhesive part at a side of the bending axis and a second adhesive part at the other side. The first and second adhesive parts have a cross-sectional shape in a plane perpendicular with the bending axis, and the cross-sectional shape is oriented with respect to a vertical cross section of the flexible display panel running through the bending axis to reduce the bending stress in the flexible display panel during bending in the bending axis.

Figure 1:
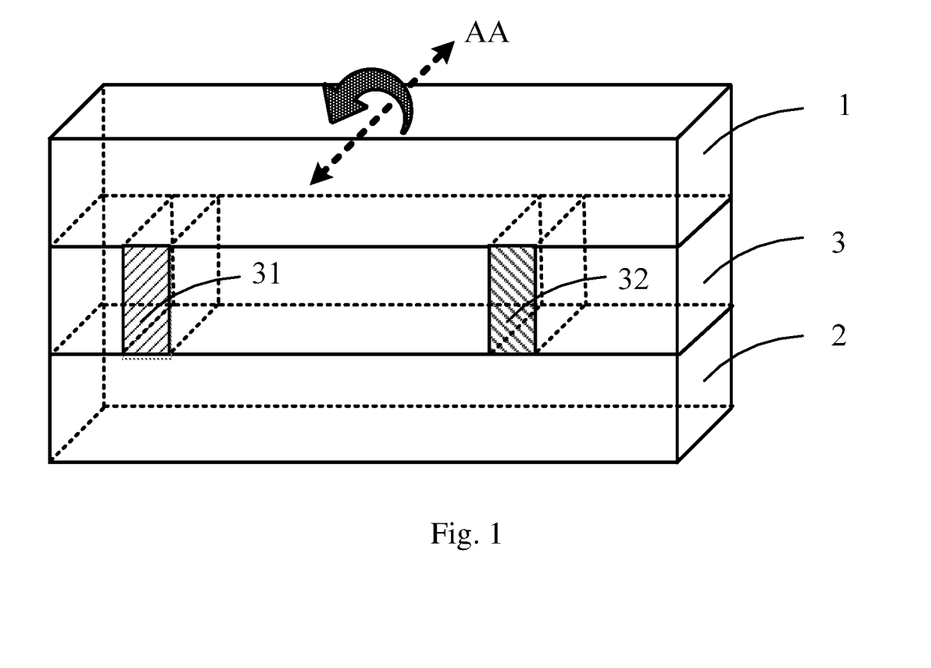
FIG. 1 is a schematic view for illustrating a flexible display panel in an embodiment of the present disclosure.

FIG. 1 is a schematic view of a flexible display panel in an embodiment of the present disclosure. In FIG. 1, reference is made to a structure comprising two functional layers and an adhesive layer between the two functional layers. As shown in FIG. 1, the flexible display panel comprises a functional layer 1, a functional layer 2, and an adhesive layer 3 which is arranged between the functional layer 1 and the functional layer 2. The display panel has a bending axis AA which is parallel with a surface of the display panel. The adhesive layer 3 comprises a first adhesive part 31 which is arranged at a side of the bending axis AA and a second adhesive part 32 which is arranged at the other side of the bending axis AA. The first adhesive part 31 and the second adhesive part 32 have a cross-sectional shape in a plane perpendicular with the bending axis AA, and the cross-sectional shape is oriented with respect to a vertical cross section of the display panel which runs through the bending axis AA, so as to reduce the bending stress in the display panel during bending in the bending axis AA.

The first adhesive part can comprise a plurality of adhesive members which are spaced apart, and the second adhesive part can also comprise a plurality of adhesive members which are spaced apart. The adhesive members in the first and second adhesive parts can extend in parallel, or extend in a non-parallel manner. The extending direction of the adhesive members can be parallel, or non-parallel with the extending direction of the bending axis. Hereinafter, reference is made to a case in which the extending direction of the adhesive members in the first and second adhesive parts is parallel with each other and the extending direction of the adhesive members is parallel with the extending direction of the bending axis.

Figure 2A:
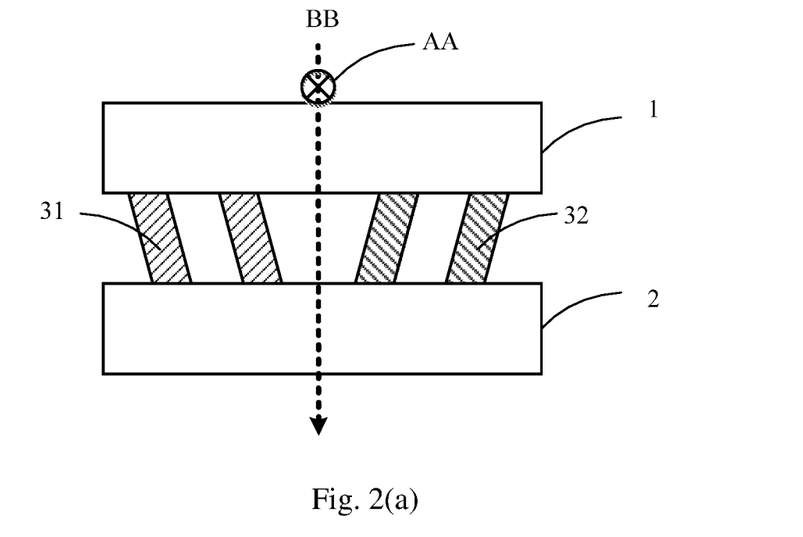
FIG. 2(a) is a schematic view for illustrating a flexible display panel in an embodiment of the present disclosure.

FIG. 2(a) is a schematic view of a flexible display panel in an embodiment of the present disclosure. In FIG. 2(a), a dotted line BB indicates vertical cross section of the flexible display panel which runs through the bending axis AA, and the direction of arrow indicates a bending direction of the display panel. As shown in FIG. 2(a), in the present embodiment, the bending direction is a downward bending direction, and the extending direction of the bending axis is perpendicular with the plane in which the figure lies. Herein, "downward bending direction" refers to a direction from a display side of the display panel to a back side of the display panel and perpendicular with the display panel, in case the flexible display panel is not bended. Similarly, "upward bending direction" refers to a direction from the back side of the display panel to the display side of the display panel and perpendicular with the display panel, in case the flexible display panel is not bended. In this case, adhesive members in the first and second adhesive parts are arranged in such a manner that a bottom part of the adhesive members is closer to the vertical cross section of the flexible display panel which runs through the bending axis that a top part of the adhesive members, so as to release the stress which is developed between the functional layer 1 and the functional layer 2 during bending.

Figure 2B:
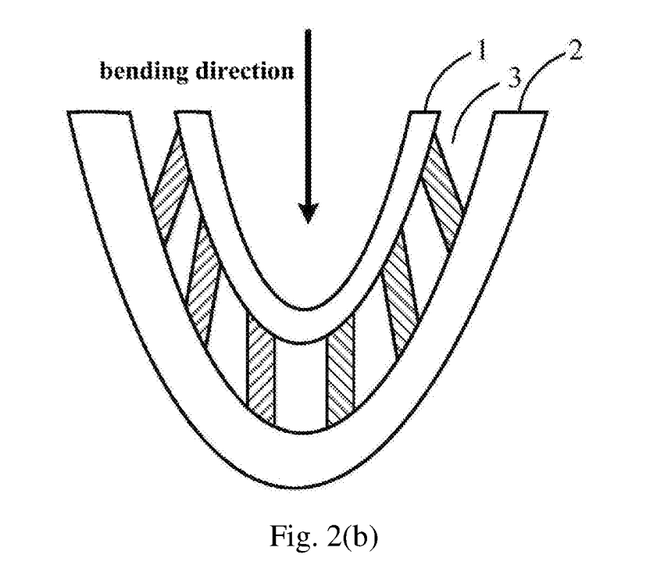
FIG. 2(b) is a schematic view for illustrating the flexible display panel of FIG. 2(a) which is being bended downward.

FIG. 2(b) is a schematic view of the flexible display panel of FIG. 2(a) during bending downward. Since in the first adhesive part 31 and the second adhesive part 32 of the flexible display panel of FIG. 2(a), each adhesive member is arranged so that its bottom part is closer to the vertical cross section of the flexible display panel than its top part, and thus is suitable for the downward bending direction. During bending downward as shown in FIG. 2(b), the adhesive members of the first and second adhesive parts are deformed, so as to release the stress which is developed between the functional layer 1 and the functional layer 2.

It is noted that the number of adhesive members is not limited to the number as shown. Furthermore, thicknesses of different layers are only exemplary, instead of limiting.

Figure 3A:
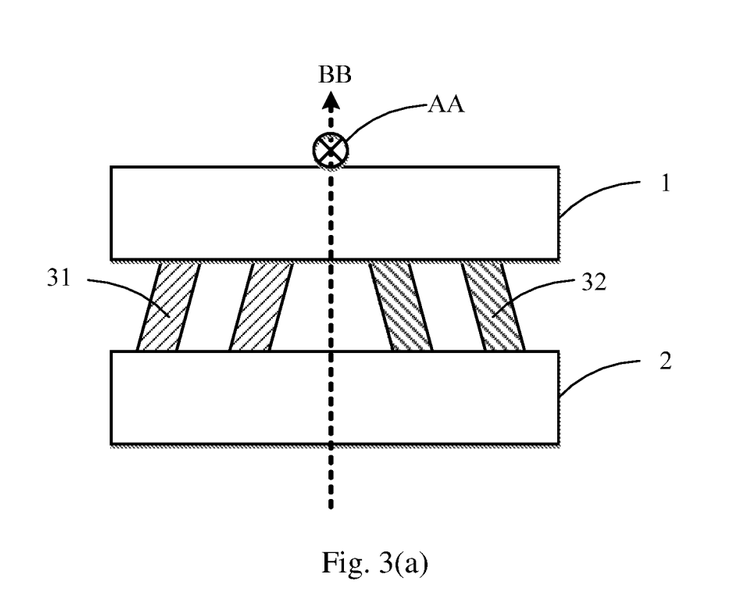
FIG. 3(a) is a schematic view for illustrating a flexible display panel in an embodiment of the present disclosure.

FIG. 3(a) is a schematic view of a flexible display panel in an embodiment of the present disclosure. In FIG. 3(a), a dotted line BB indicates the vertical cross section of the flexible display panel which is defined by the bending axis AA, and the direction of arrow indicates a bending direction of the display panel. As shown in FIG. 3(a), in the present embodiment, the bending direction is an upward bending direction, and the extending direction of the bending axis is perpendicular with the plane in which the figure lies. In this case, adhesive members in the first and second adhesive parts are arranged in such a manner that a top part of the adhesive members is closer to the vertical cross section of the flexible display panel which runs through the bending axis that a bottom part of the adhesive members, so as to release the stress which is developed between the functional layer 1 and the functional layer 2 during bending.

Figure 3B:
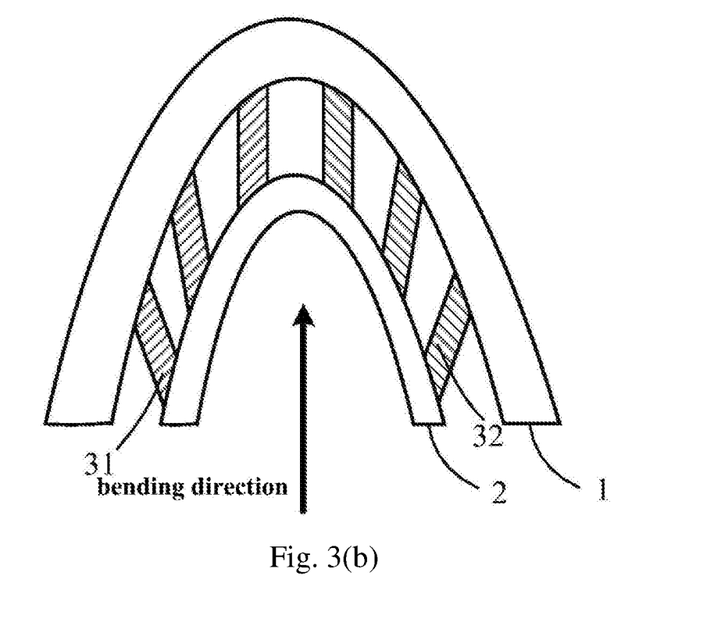
FIG. 3(b) is a schematic view for illustrating the flexible display panel of FIG. 3(a) which is being bended downward.

FIG. 3(b) is a schematic view of the flexible display panel of FIG. 3(a) during bending upward. Since in the first adhesive part 31 and the second adhesive part 32 of the flexible display panel of FIG. 3(a), each adhesive member is arranged so that its top part is closer to the vertical cross section of the flexible display panel than its bottom part, and thus is suitable for the upward bending direction. During bending upward as shown in FIG. 3(b), the adhesive members of the first and second adhesive parts are deformed, so as to release the stress which is developed between the functional layer 1 and the functional layer 2.

Figure 4:
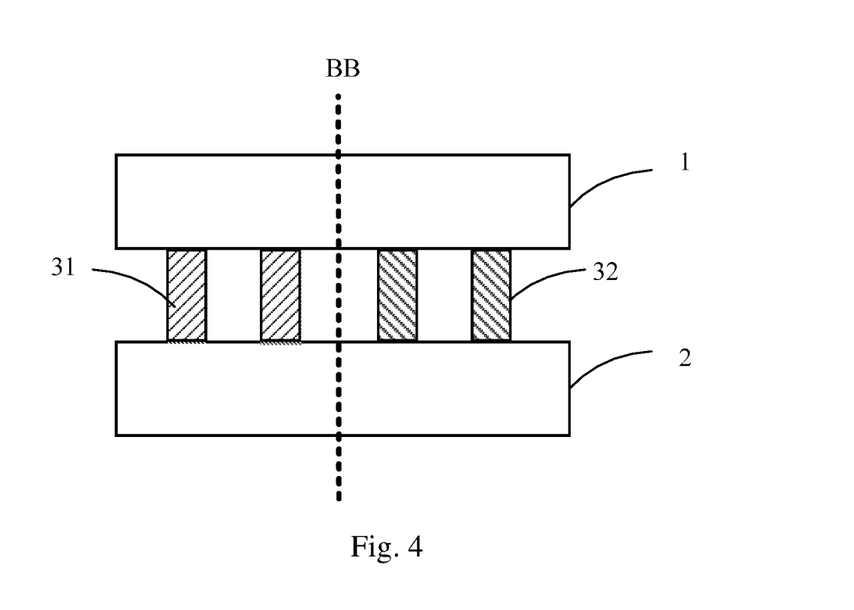
FIG. 4 is a schematic view for illustrating a flexible display panel in an embodiment of the present disclosure.

FIG. 4 is a schematic view of a flexible display panel in an embodiment of the present disclosure. In FIG. 4, BB indicates the vertical cross section of the display panel which is defined by the bending axis (see FIG. 1). As shown in FIG. 4, each adhesive member in the first adhesive part 31 and the second adhesive part 32 has a top part and a bottom part, and a distance from the top part to the vertical cross section of the flexible display panel equals to a distance from the bottom part to the vertical cross section of the flexible display panel, so as to be suitable for upward or downward bending direction. The flexible display panel shown in FIG. 4 can not only be applied to a downward bending direction, but also to an upward bending direction. During bending downward or upward, the adhesive members of the first and second adhesive parts are deformed, so as to release the stress which is developed between the functional layer 1 and the functional layer 2.

The functional layer 1 and the functional layer 2 can a display layer and a touch layer which is arranged on the display layer, respectively. However, other functional layers can be provided as necessary.

Figure 5:
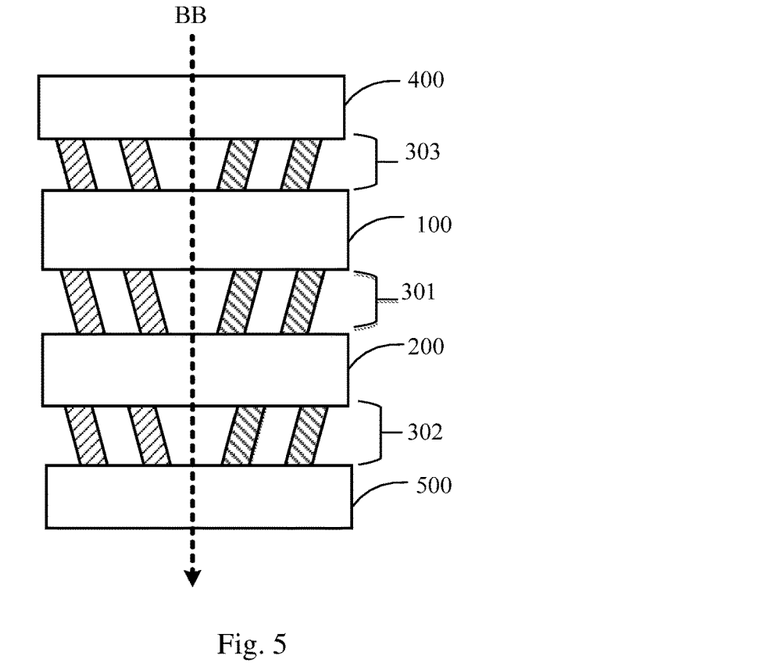
FIG. 5 is a schematic view for illustrating a flexible display panel in an embodiment of the present disclosure.

FIG. 5 is a schematic view of a flexible display panel in an embodiment of the present disclosure. In FIG. 5, reference is made to a case in which the flexible display panel is user for bending in the downward direction. As shown in FIG. 5, the at least two functional layers of the flexible display panel comprise: a display layer 200, a touch layer 100 on the display layer 200, a protection layer 400 which is arranged on the touch layer 100, and a lower protection layer 500 which is arranged below the display layer 200. The adhesive layer of the flexible display panel comprises: a first adhesive layer 301 which is arranged between the display layer 200 and the touch layer 100, a second adhesive layer 302 which is arranged between the display layer 200 and the lower protection layer 500, and a third the adhesive layer 303 which is arranged between the touch layer 100 and upper the protection layer 400.

Figure 6:
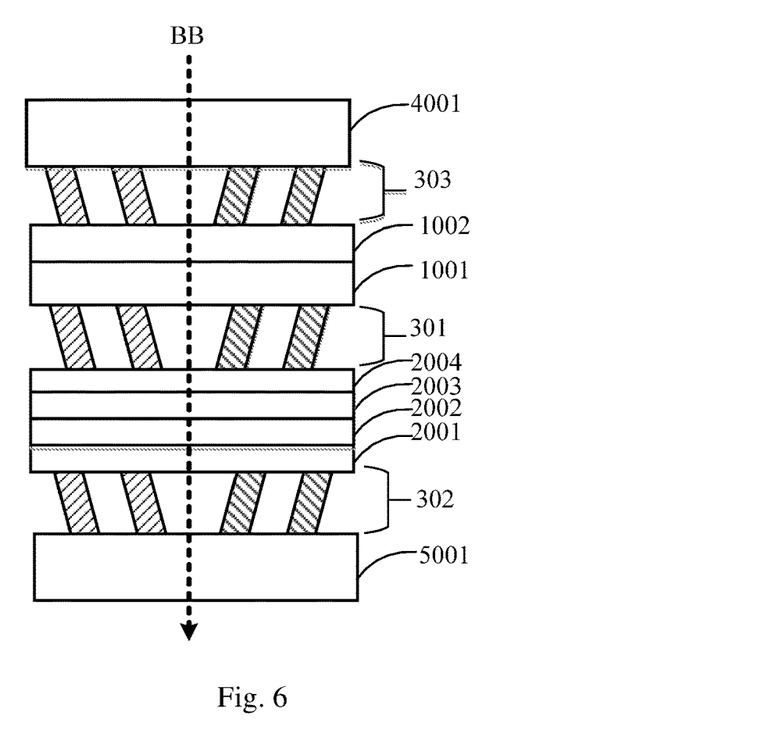
FIG. 6 is a schematic view for illustrating a flexible display substrate in an embodiment of the present disclosure.

FIG. 6 is a schematic view of a flexible display substrate in an embodiment of the present disclosure. In FIG. 6, reference is made to a case in which the flexible display panel is user for bending in the downward direction.

As shown in FIG. 6, the lower protection layer can comprise a lower protection film 5001 which provides a supporting and protecting function. The display layer can comprise: a flexible substrate 2001 which is arranged on the lower protection film 5001, a substrate 2002 which is arranged on the flexible substrate 2001, an organic light emitting layer (OLED) 2003 which is arranged on the substrate 2002, and an encapsulating layer 2004 which is arranged on the organic light emitting layer 2003.

The touch layer can comprise: a touch screen panel (TSP) sensor 1001 which is arranged on the encapsulating layer 2004, and a polarizing filter 1002 which is arranged on the touch screen panel sensor (e.g., a circular-polarizing filter (C-POL) for improving contrast).

The flexible substrate 2001 can comprise polyimide (PI). The substrate 2002 can comprise low temperature polysilicon (LTPS). The light emitting layer 2003 can comprise an organic light emitting layer (OLED). The encapsulating layer 2004 can comprise a thin film encapsulation (TFE) layer.

Embodiments of the present disclosure do not intend to limit the adhesive agent in term of its material. For example, the adhesive layer can comprise an adhesive agent with good transparent property. In order to provide improved light transmittance, the adhesive layer can be arranged to avoid the pixel region of the display layer. Namely, the adhesive layer can be arranged so that its projection on the display layer does not overlap with the pixel region of the display layer.

Figure 7A:
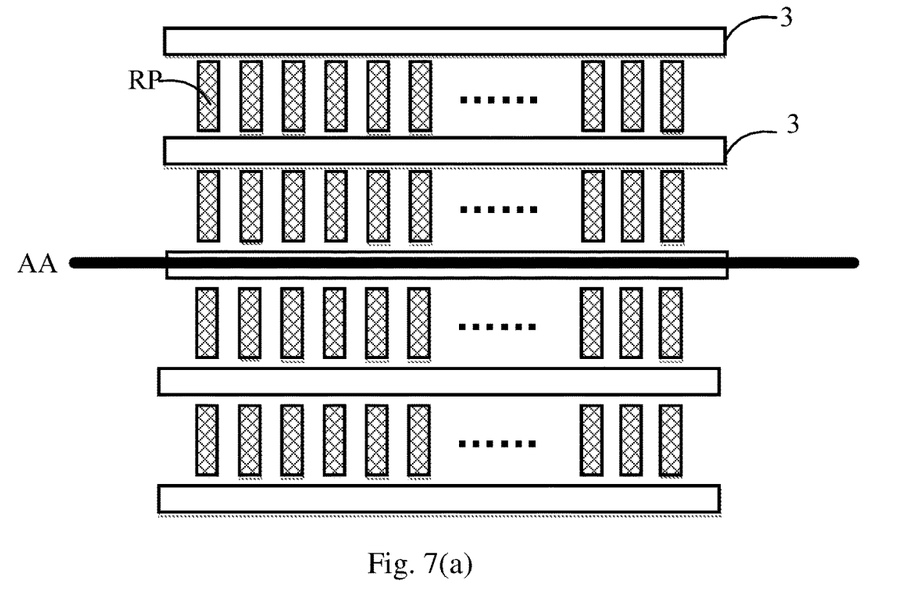
FIG. 7(a) is a schematic view for illustrating a projection of an adhesive layer of a flexible display panel on a display layer in an embodiment of the present disclosure.

FIG. 7(a) is a schematic view of a projection of an adhesive layer of a flexible display panel on a display layer in an embodiment of the present disclosure. As shown in FIG. 7(a), the display layer of the flexible display panel comprises a pixel array which consists of pixel regions RP. The adhesive members of the adhesive layer 3 can extend in a row direction of the pixel array, and a projection of the adhesive layer on a display layer does not overlap with the pixel region of the display layer. In the adhesive layer 3, the adhesive members are spaced apart one another, and the extending direction of each adhesive member is parallel with the extending direction of the bending axis AA. As can be seen from FIG. 7(a), the projection of the adhesive layer 3 on the display layer does not overlap with the pixel region of the display layer.

Figure 7B:
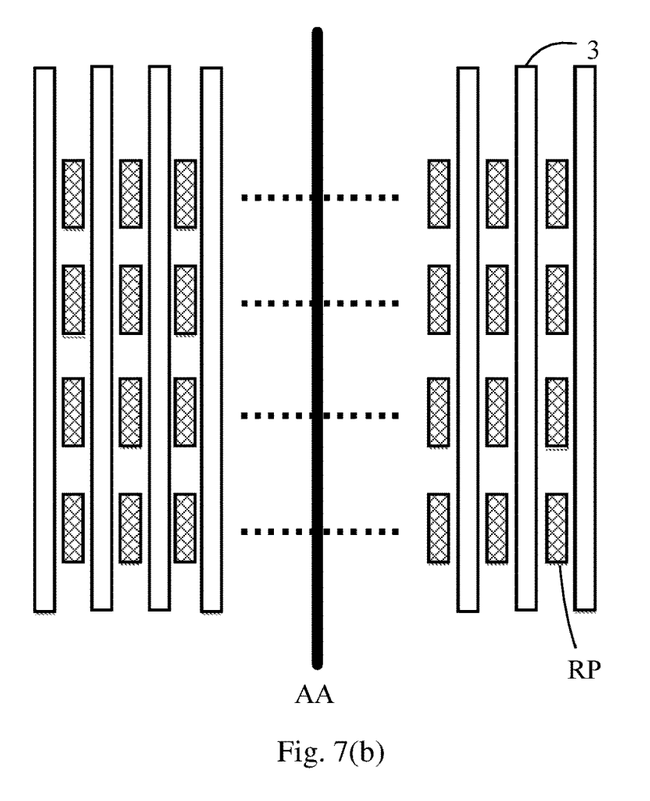
FIG. 7(b) is a schematic view for illustrating a projection of an adhesive layer of a flexible display panel on a display layer in an embodiment of the present disclosure.

FIG. 7(b) is a schematic view of a projection of an adhesive layer of a flexible display panel on a display layer in an embodiment of the present disclosure. As shown in FIG. 7(b), the display layer of the flexible display panel comprises a pixel array which consists of pixel regions RP. The adhesive members of the adhesive layer 3 can extend in a column direction of the pixel array, and a projection of the adhesive layer on a display layer does not overlap with the pixel region of the display layer. In the adhesive layer 3, the adhesive members are spaced apart one another, and the extending direction of each adhesive member is parallel with the extending direction of the bending axis AA. As can be seen from FIG. 7(b), the projection of the adhesive layer 3 on the display layer does not overlap with the pixel region of the display layer.

An embodiment of the present disclosure further provides a method for fabricating a flexible display panel.

Figure 8:
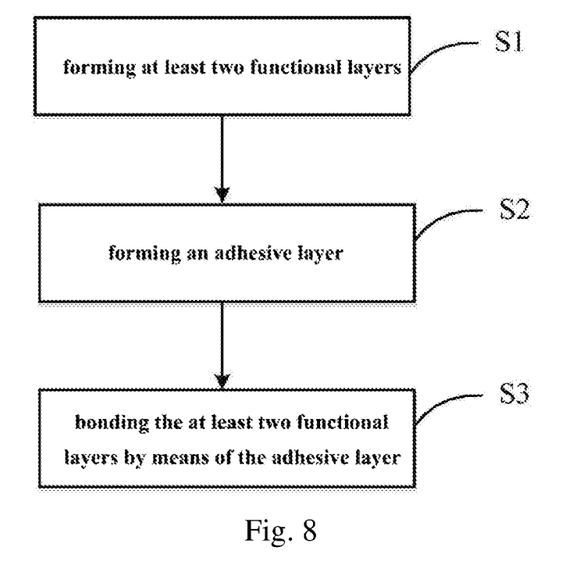
FIG. 8 is a schematic flow char for illustrating a method for fabricating a flexible display panel in an embodiment of the present disclosure.

FIG. 8 is a flow chart of a method for fabricating a flexible display panel in an embodiment of the present disclosure. As shown in FIG. 8, the method for fabricating a flexible display panel comprises:

S1. forming at least two functional layers.

S2. forming an adhesive layer. Forming the adhesive layer comprises forming the adhesive layer which comprises a first adhesive part at a side of a bending axis which is parallel with a surface of the flexible display panel and a second adhesive part at the other side of the bending axis, wherein the first adhesive part and the second adhesive part have a cross-sectional shape in a plane perpendicular with the bending axis, and the cross-sectional shape is oriented with respect to a vertical cross section of the flexible display panel which runs through the bending axis, so as to reduce the bending stress in the flexible display panel during bending in the bending axis.

S3. bonding the at least two functional layers by means of the adhesive layer.

The first adhesive part can comprise a plurality of adhesive members which are spaced apart, and the second adhesive part can also comprise a plurality of adhesive members which are spaced apart. The adhesive members of the first adhesive part and the adhesive members of the second adhesive part have extending directions which can be parallel, or not parallel with each other. The extending direction of each of the adhesive members can be parallel, or not parallel with the extending direction of the bending axis.

In an embodiment, forming the adhesive layer comprises forming the adhesive layer by at least one of imprinting and printing.

Embodiments of the present disclosure provide a technical solution for improving bending resistance of a display panel and a display device. In the flexible display panel which has a bending axis parallel with the surface of the flexible display panel, the adhesive layer is configured to comprise a first adhesive part at a side of the bending axis and a second adhesive part at the other side of the bending axis. The first adhesive part and the second adhesive part have a cross-sectional shape in a plane perpendicular with the bending axis, and the cross-sectional shape is oriented with respect to a vertical cross section of the flexible display panel which runs through the bending axis, so as to reduce the bending stress in the flexible display panel during bending in the bending axis. This can release during stress between the functional layers during bending, improve the bending resistance of the flexible display panel, and improve the performance of the flexible display panel.

The flexible display device in the present embodiment can be any product or component with a display function like a mobile phone, tablet computer, TV, notebook computer, digital photo frame, navigator, or the like.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. A flexible display panel, comprising: at least two functional layers which are stacked one another and an adhesive layer which is arranged between the at least two functional layers, wherein the flexible display panel has a bending axis parallel with a surface of the flexible display panel, wherein the adhesive layer comprises a first adhesive part at a side of a first plane and a second adhesive part at the other side of the first plane, and the first plane runs through the bending axis and is perpendicular with the surface of the flexible display panel, wherein the first adhesive part and the second adhesive part have a cross-sectional shape in a second plane perpendicular with the bending axis, and the cross-sectional shape is oriented with respect to the first plane, so as to reduce the bending stress in the flexible display panel during bending in the bending axis, wherein in case the flexible display panel is not bended, each adhesive member in the first adhesive part and the second adhesive part has a bottom part and a top part, and the bottom part is closer to the first plane than the top part, so as to be suitable for a downward bending direction, or each adhesive member in the first adhesive part and the second adhesive part has a top part and a bottom part, and the top part is closer to the first plane than the bottom part, so as to be suitable for an upward bending direction, and wherein in case the flexible display panel is not bended, the cross-sectional shape of each adhesive member in the first adhesive part and the second adhesive part in the second plane has a width in a direction perpendicular with the bending direction, and the width is constant in an extending direction of each adhesive member.

2. The flexible display panel of claim 1, wherein the first adhesive part comprises a plurality of adhesive members which are spaced apart, the second adhesive part comprises a plurality of adhesive members which are spaced apart, and the adhesive members of the first adhesive part and the adhesive members of the second adhesive part have extending directions which are parallel with each other.

3. The flexible display panel of claim 2, wherein the extending directions of the adhesive members are parallel with an extending direction of the bending axis.

4. The flexible display panel of claim 3, wherein each adhesive member in the first adhesive part and the second adhesive part has a top part and a bottom part, and a distance from the top part to the first plane equals to a distance from the bottom part to the first plane, so as to be suitable for upward or downward bending direction.

5. The flexible display panel of claim 3, wherein the at least two functional layers comprise a display layer and a touch layer which is arranged on the display layer.

6. The flexible display panel of claim 2, wherein the at least two functional layers comprise a display layer and a touch layer which is arranged on the display layer.

7. The flexible display panel of claim 1, wherein the at least two functional layers comprise a display layer and a touch layer which is arranged on the display layer.

8. The flexible display panel of claim 7, wherein a projection of the adhesive layer on the display layer does not overlap with a pixel region of the display layer.

9. The flexible display panel of claim 8, wherein the at least two functional layers further comprise:
    an upper protection layer which is arranged on the touch layer; and
    a lower protection layer which is arranged below the display layer,
    wherein the adhesive layer comprises:
    a first adhesive layer which is arranged between the display layer and the touch layer;
    a second adhesive layer which is arranged between the display layer and the lower protection layer; and
    a third adhesive layer which is arranged between the touch layer and the upper protection layer.

10. The flexible display panel of claim 9, wherein the lower protection layer comprises a lower protection film;
    the display layer comprises: a flexible substrate which is arranged on the lower protection film, a substrate which is arranged on the flexible substrate, a light emitting layer which is arranged on the substrate, and an encapsulating layer which is arranged on the light emitting layer;
    the touch layer comprises: a touch screen panel sensor which is arranged on the encapsulating layer, and a polarizing filter which is arranged on the touch screen panel sensor;
    the upper protection layer comprises an upper protection film.

11. The flexible display panel of claim 10, wherein the first adhesive layer, the second adhesive layer and the third adhesive layer have extending directions which are parallel with each other.

12. The flexible display panel of claim 9, wherein the first adhesive layer, the second adhesive layer and the third adhesive layer have extending directions which are parallel with each other.

13. A flexible display device, comprising the flexible display panel of claim 1.

14. A method for fabricating a flexible display panel, comprising:
    forming at least two functional layers;
    forming an adhesive layer;
    bonding the at least two functional layers by means of the adhesive layer,
    wherein forming the adhesive layer comprises forming the adhesive layer which comprises a first adhesive part at a side of a first plane and a second adhesive part at the other side of the first plane, and the first plane runs through a bending axis parallel with a surface of the flexible display panel and is perpendicular with the surface of the flexible display panel,
    wherein the first adhesive part and the second adhesive part have a cross-sectional shape in a second plane perpendicular with the bending axis, and the cross-sectional shape is oriented with respect to the first plane, so as to reduce the bending stress in the flexible display panel during bending in the bending axis,
    wherein in case the flexible display panel is not bended, each adhesive member in the first adhesive part and the second adhesive part has a bottom part and a top part, and the bottom part is closer to the first plane than the top part, so as to be suitable for a downward bending direction, or each adhesive member in the first adhesive part and the second adhesive part has a top part and a bottom part, and the top part is closer to the first plane than the bottom part, so as to be suitable for an upward bending direction, and
    wherein in case the flexible display panel is not bended, the cross-sectional shape of each adhesive member in the first adhesive part and the second adhesive part in the second plane has a width in a direction perpendicular with the bending direction, and the width is constant in an extending direction of each adhesive member.

15. The method of claim 14, wherein the first adhesive part comprises a plurality of adhesive members which are spaced apart, the second adhesive part comprises a plurality of adhesive members which are spaced apart, and the adhesive members of the first adhesive part and the adhesive members of the second adhesive part have extending directions which are parallel with each other.

16. The method of claim 15, wherein the extending directions of the adhesive members are parallel with an extending direction of the bending axis, and
    wherein forming the adhesive layer comprises forming the adhesive layer by at least one of imprinting and printing.

* * * * *